US005537084A

United States Patent [19]

Schaeffer

[11] Patent Number: 5,537,084

[45] Date of Patent: Jul. 16, 1996

[54] METHOD FOR IMPROVING SPECTRUM QUALITY OF LOW POWER PULSED ANODE MAGNETRONS

[75] Inventor: Gregory T. Schaeffer, Williamsport, Pa.

[73] Assignee: Litton Systems, Inc., Woodland Hills, Calif.

[21] Appl. No.: 312,609

[22] Filed: Sep. 27, 1994

Related U.S. Application Data

[62] Division of Ser. No. 15,549, Feb. 9, 1993, Pat. No. 5,422, 542.

[51] Int. Cl.$^6$ .............................. H03B 1/04; H03B 9/10

[52] U.S. Cl. .............................. 331/44; 331/87; 331/90; 331/91; 315/39.61

[58] Field of Search .............................. 331/44, 86, 87, 331/90, 91; 315/39.55, 39.61

[56] References Cited

U.S. PATENT DOCUMENTS

| | | | |
|---|---|---|---|
| 4,338,545 | 7/1982 | Koinuma et al. | 315/39.71 |
| 4,831,341 | 5/1989 | Brady | 331/90 |

FOREIGN PATENT DOCUMENTS

| | | |
|---|---|---|
| 674035 | 6/1952 | United Kingdom . |

OTHER PUBLICATIONS

"Vacuum Tubes" by Spangenberg, McGraw–Hill 1948, pp. 660–661.

*Primary Examiner*—Siegfried H. Grimm
*Attorney, Agent, or Firm*—Graham & James

[57] ABSTRACT

An improved low power pulsed anode magnetron is provided having a cylindrical cathode centrally disposed within a plurality of radial anode vanes. An interaction region is provided between the surface of the cathode and the anode vane tips. A ratio of the anode-to-cathode space over the center-to-center distance between adjacent vane tips is within a range between 0.95 and 1.05. The cathode is joined to a magnetic polepiece assembly which channels magnetic flux to the interaction region. Both the cathode and the polepiece are mechanically adjustable from external to the magnetron to reposition the cathode and polepiece with respect to the anode vanes. The cathode surface is formed from an active nickel alloy which is cleaned by a chemical process followed by a high temperature and vacuum firing. An emissive surface is applied over the cleaned cathode surface. The output spectrum of the magnetron is calibrated by applying a sequential pulsed input of increasing amplitude, and adjusting the relative cathode-anode position until the frequency spectrum remains constant.

4 Claims, 5 Drawing Sheets

METHOD FOR IMPROVING SPECTRUM QUALITY OF LOW POWER PULSED ANODE MAGNETRONS

This is a divisional of application Ser. No. 08/015,549, filed on Feb. 09, 1993, and now U.S. Pat. No. 5,422,542.

BACKGROUND OF THE INVENTION

1. Field of the Invention

The present invention relates to low power pulsed anode magnetrons used to provide microwave energy, and more particularly, to a method for improving the output spectrum quality of the magnetrons.

2. Description of the Related Art

Low power pulsed anode magnetrons are commonly used to generate RF energy for assorted microwave applications such as airborne weather radar. The magnetrons commonly have a cylindrically shaped cathode centrally disposed a fixed distance from a plurality of radially extending anode vanes. The space between the cathode surface and the anode vane tips provides an interaction region, and a potential is applied between the cathode and the anode, forming an electric field in the interaction region. A magnetic field is provided perpendicular to the electric field and is directed to the interaction region by polepieces which adjoin permanent magnets. An internal heater is provided below the surface of the cathode, and by heating the cathode electrons are emitted thermionically. Electrons emitted from the cathode surface are caused to orbit around the cathode in the interaction region due to the magnetic field, during which they interact with an RF wave moving on the anode vane structure. The electrons give off energy to the moving RF wave, thus producing a high power microwave output signal.

Traditionally, weather radar systems were primarily directed towards identifying and localizing areas of increased density, such as clouds or other aircraft. In such applications, spectral control is less critical than overall output power. However, modern radar systems have placed increased emphasis on identifying slight changes in air pressure and utilize doppler effects to obtain greater detailed information. For example, wind shear can be identified through measurements of instantaneous changes of air pressure. To make these measurements, the radar system must detect very small frequency changes of the radar return signal. These operational demands have required that there be tighter control over the output frequency spectrum of the magnetrons than has been previously required.

Most commercial pulsed anode magnetrons suffer from two related problems which tend to degrade the consistency of the output frequency spectrum. A first problem experienced is that of undesired side lobes. A side lobe comprises a secondary rise in amplitude at a peripheral portion of the output spectrum, which essentially increases the bandwidth of the spectrum. The side lobe draws power away from the usable spectrum, thus wasting a portion of the output power of the magnetron. Moreover, by increasing the spectral width, it is increasingly difficult to detect minor frequency changes in the radar return signal.

A secondary problem facing commercial pulsed anode magnetrons is that Of "twinning." The twinning phenomenon comprises the formation of a twin output signal, which duplicates a portion of the spectrum. In some cases, the problems do not surface until after the magnetrons have been deployed in operational radar units. The distorted signal can result in false readings by the operator of the radar system, which detects a phantom frequency shift caused by the presence of the twin signal. Output spectrums exhibiting the twinning phenomenon and the side lobes phenomenon are shown graphically in FIGS. 1 and 2, respectively.

Thus, there is a need to provide a low power pulsed anode magnetron having improved spectral quality and performance, without the problems of side lobes and twinning. In addition, it is further desirable to provide a method for improving the spectral quality of a magnetron both during and after assembly.

SUMMARY OF THE INVENTION

In addressing these needs and deficiencies in the prior art, an improved low power pulsed anode magnetron is provided. The magnetron is disposed within an outer case, and has a cylindrical cathode which is centrally disposed within a plurality of radially extending anode vanes. An interaction region is provided between the-surface of the cathode and the anode vane tips. A ratio of the anode to cathode space over the center-to-center distance between adjacent vane tips is within a range between 0.95 and 1.05.

In a first embodiment of the present invention, the cathode is assembled to a magnetic polepiece assembly, which channels magnetic flux to the interaction region. The polepiece physically abuts a permanent magnet which provides the magnetic flux, and which is in turn supported by a magnetic plate. A plurality of mechanical set screws accessible from outside the magnetron case can be adjusted to apply pressure on the magnetic plate to reposition the cathode and polepiece with respect to the anode vanes. A deformable pole sleeve is secured to the polepiece and is mechanically assembled to an anode sleeve which supports the anode vanes. Adjustment of the magnetic plate position relative to the outer case permanently deforms the pole sleeve to maintain the cathode and polepiece in the adjusted position.

In accordance with an alternative embodiment of the present invention, a method for adjusting a low power pulsed anode magnetron is provided. A modulator provides an input signal to the magnetron, comprising a repetitive sequence of three pulses of increasing amplitude. The magnetron output spectrum is observed by a spectrum analyzer. Incremental adjustments are made to the magnetic plate until a consistent output spectrum is observed in response to the ascending amplitude input signals.

In yet another embodiment of the present invention, an improved cathode surface is provided. The surface is formed from an active nickel alloy, which is chemically cleaned and high temperature dry hydrogen fired, followed by a vacuum firing. An emissive material is then sprayed onto the cleaned cathode surface. The resulting cathode is essentially free of contaminant materials, and has a smoother surface over that of conventional cathodes., A more complete understanding of the improved low power pulsed anode magnetron of the present invention will be afforded to those skilled in the art as well as a realization of additional advantages and objects thereof, by a consideration of the following detailed description of the preferred embodiment. Reference will be made to the appended sheets of drawings, which will be first described briefly.

DETAILED DESCRIPTION OF THE PREFERRED EMBODIMENT

The present invention represents a significant improvement over the prior art in that it provides a low power pulsed anode magnetron for generation of microwave energy having improved spectral quality. An important aspect of this invention is the recognition that the two problems are due in part to the alignment and spacing of the cathode, anode vanes and polepiece. Further, the irregular surface of the cathode contributed to the problems by producing an inconsistent electric field in the interaction region. The invention provides modifications to traditional spacing of the magnetron components, an improved surfacing technique for the cathode, and a method for calibrating the magnetron after assembly to correct for spacing inconsistencies. The combination of these solutions results in a magnetron having superior spectral performance over that of conventional magnetrons.

Figure 1:
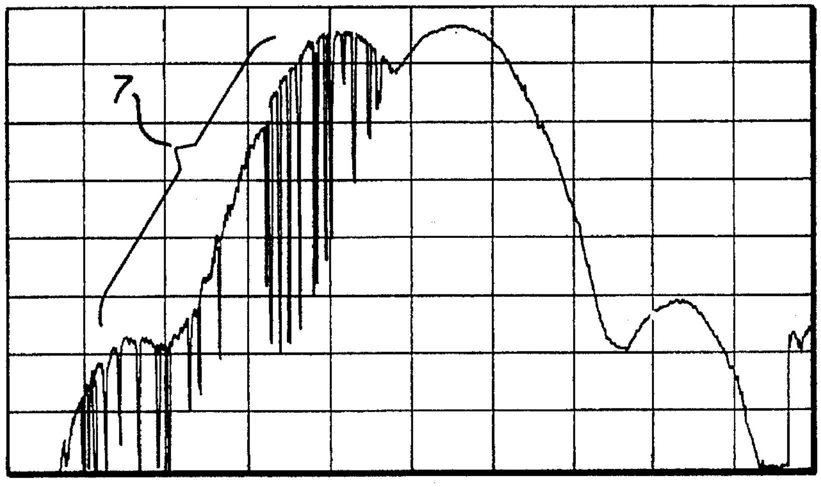
FIG. 1 is a graph showing the output frequency spectrum of a low power pulsed anode magnetron exhibiting the problem of twinning.
Figure 2:
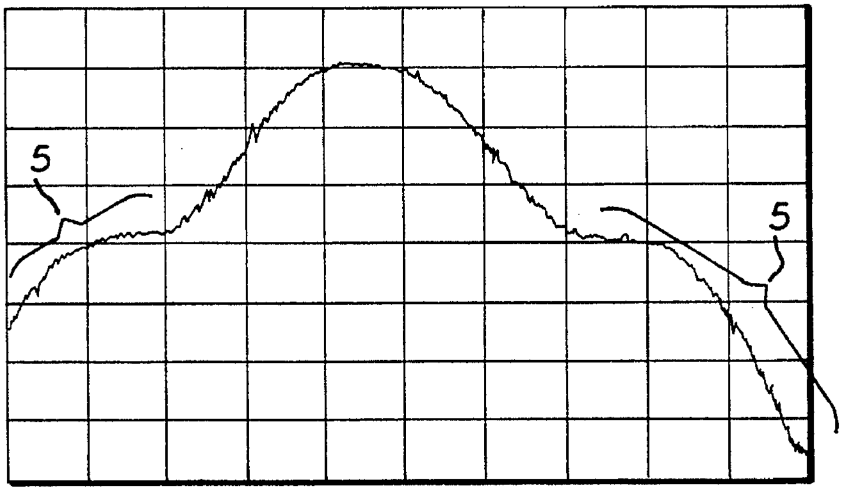
FIG. 2 is a graph showing the output frequency spectrum of a magnetron exhibiting the problem of excessive side lobes.
Figure 3:
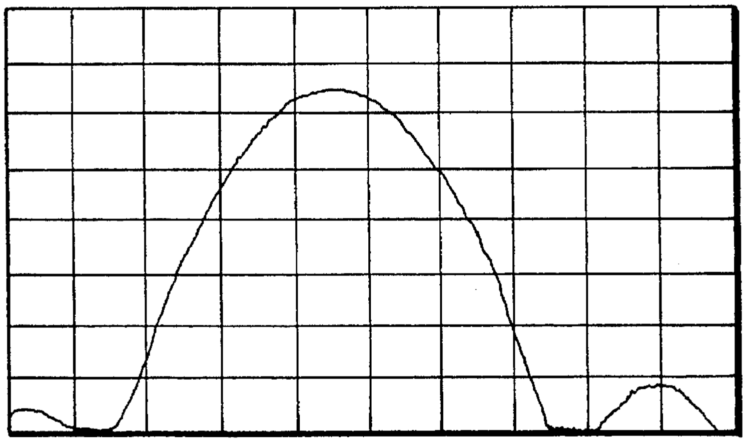
FIG. 3 is a graph showing a proper output frequency spectrum of a magnetron in accordance with the teachings of the present invention.

FIGS. 1 and 2 graphically illustrate the problems associated with conventional pulsed anode magnetrons. The graphs show magnetron frequency along the horizontal axis, and amplitude along the vertical axis. The twinning and side lobes are clearly evident in the spectrums of FIGS. 1 and 2, respectively, as compared to FIG. 3 which is an ideal spectrum of a pulsed anode magnetron. A side lobe is shown at 5 of FIG. 2, and the twinning is shown at 7 of FIG. 1. The twinning comprises displaced lines from the main spectrum envelope. Each line represents the repetition rate of the applied pulse voltage, and the displacements occur when the beam in the interaction region shifts for that pulse period.

Figure 4:
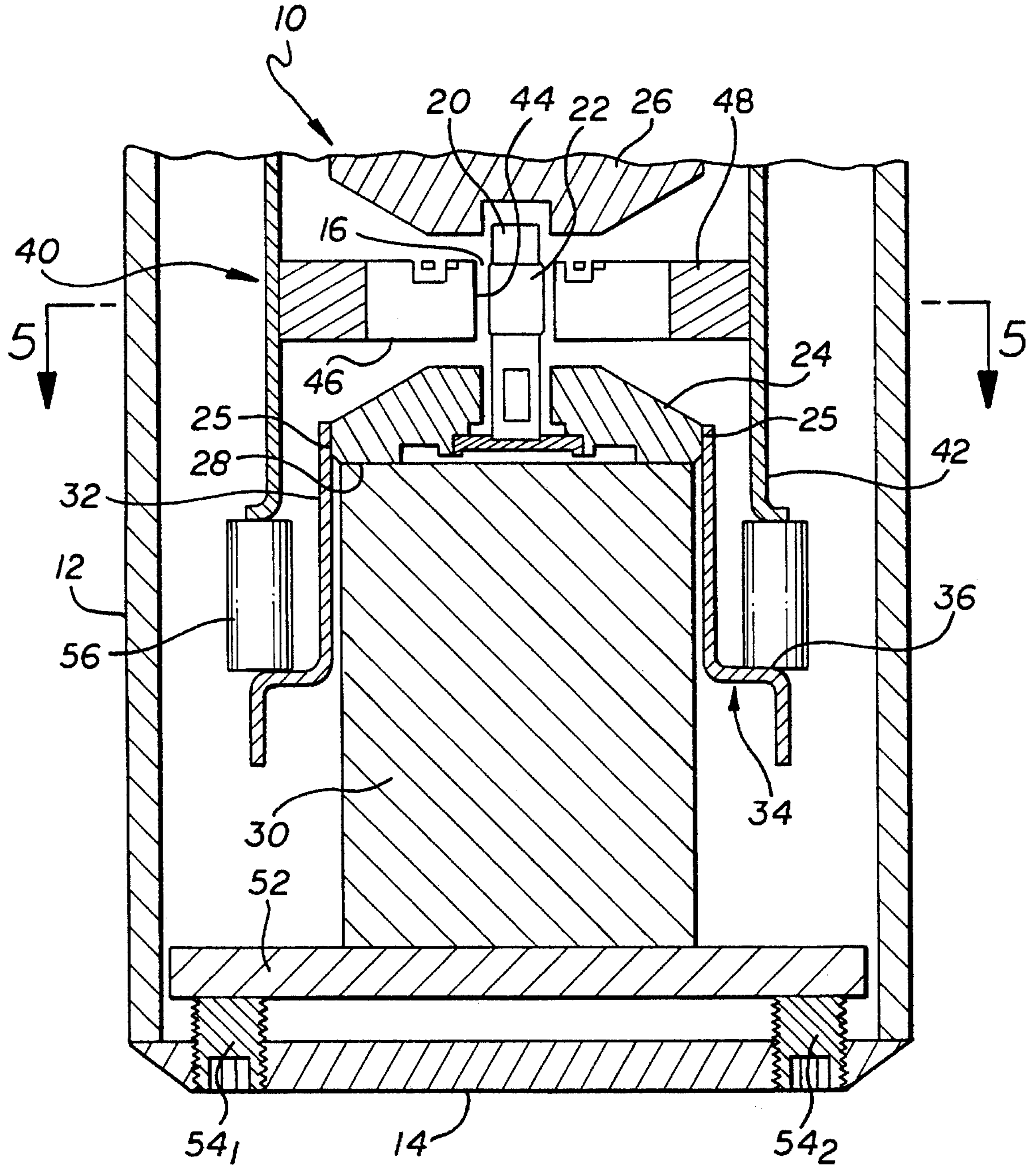
FIG. 4 is a sectional side view of a preferred embodiment of a magnetron of the present invention.
Figure 5:
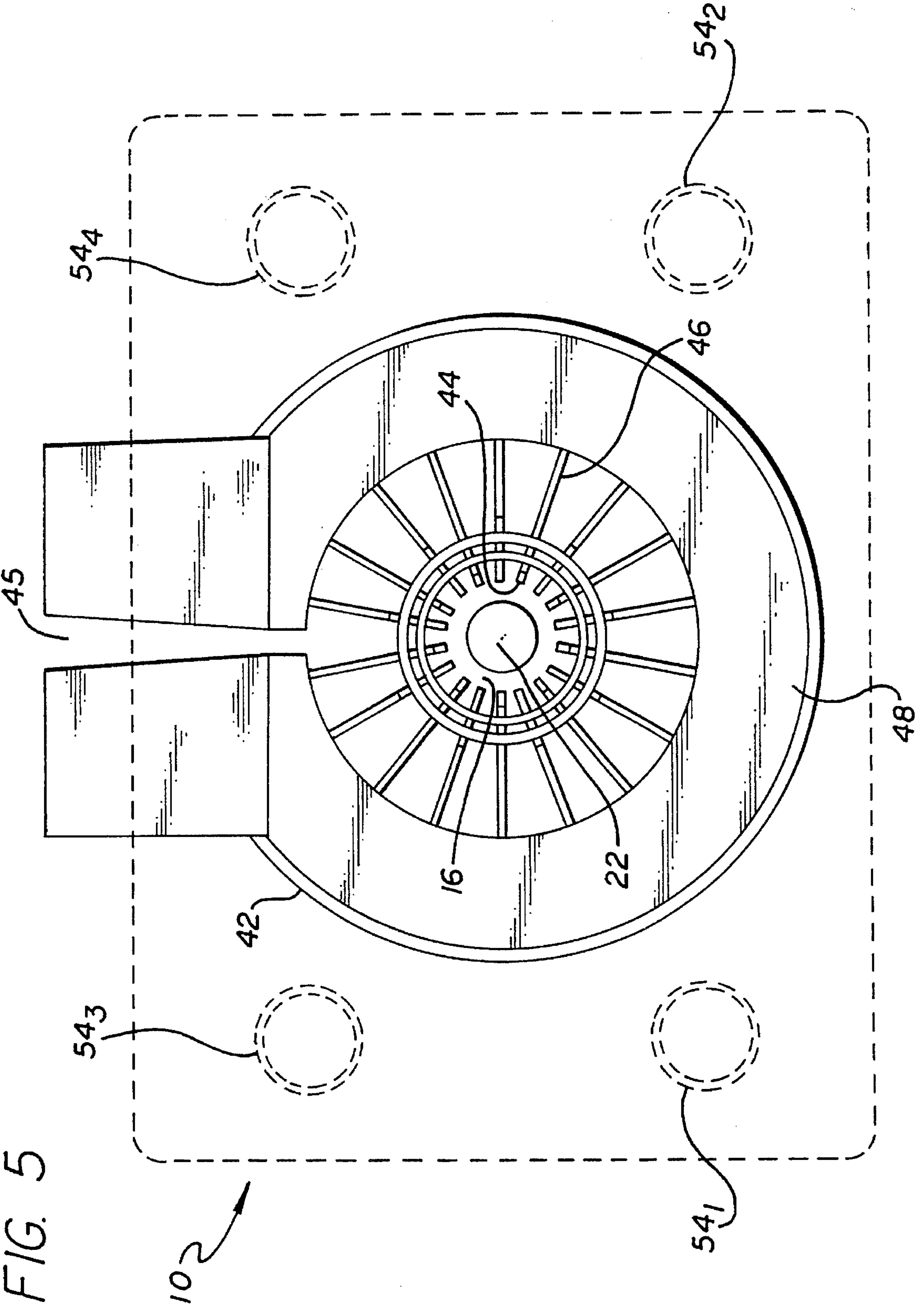
FIG. 5 is a sectional top view of the magnetron as taken through the section 5—5 of FIG. 4.

Referring now to FIGS. 4 and 5, there is shown a low power pulsed anode magnetron according to the present invention. The magnetron 10 has an external case 12 which is enclosed by a bottom panel 14. The magnetron 10 is a relatively light weight and compact unit, having an overall length of approximately two and one half inches.

The magnetron 10 has a cathode structure 20 with a cathode emitting surface 22. An anode structure, shown generally at 40, surrounds the cathode emitting surface 22, and includes a support sleeve 42, an anode ring 48 and a plurality of anode vanes 46 extending radially inward from the ring 48. An opening 45 in the ring 48 provides for the output of microwave energy from the magnetron 10. Each vane 46 has a tip 44 which faces the cathode emitting surface 22. An interaction region 16 is thus provided between the vane tips 44 and the cathode surface 22. An electric field is formed in the interaction region by providing a high positive voltage to the anode structure 40, which draws the thermionically emitted electrons from the emitting surface 22.

The cathode structure 20 extends from and is physically secured to a central region of a magnetic polepiece 24. The polepiece 24 has a surface 28 which directs magnetic flux from a magnet 30 to produce a magnetic field in the interaction region 16. A second polepiece 26 is disposed opposite the first polepiece 24, and a magnetic field is formed between them. As known in the art, the direction of the magnetic field is generally perpendicular to the electric field formed between the cathode surface 22 and the anode structure. The intersection of the magnetic and electric fields causes the emitted electrons to spiral into orbit around the cathode 20 after being emitted from the cathode surface 22.

A pole sleeve 32 is affixed to the polepiece ends 25 and extends over a portion of the magnet 30. The pole sleeve 32 is formed from a nonmagnetic metal material, such as monel. The pole sleeve 32 has an elbow joint 34 that extends radially outward forming a support flange 36. The flange 36 supports an insulator ring 56 which in turn supports the anode support sleeve 42. Accordingly, the pole sleeve 32 is critical to alignment between the cathode surface 22 and the anode vane tips 44.

Figure 9:
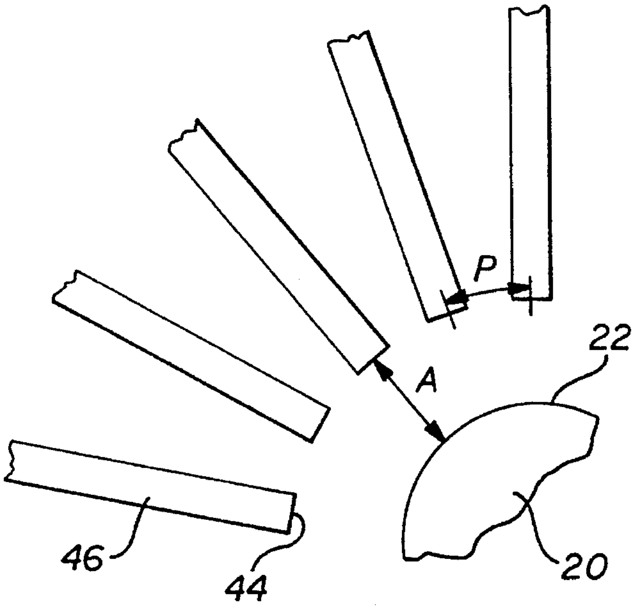
FIG. 9 shows a detailed top view of a portion of FIG. 5, showing the anode and cathode spacing.

Substantial improvement in magnetron performance has been demonstrated by implementing a combination of changes, including altering the anode to cathode spacing from that of conventional magnetrons. A standard parameter used in magnetron design is the ratio of a/p, in which a is the anode to cathode spacing, and p is the pitch comprising the center-to-center distance between adjacent vane tips according to the equation:

$$p = \frac{2\pi R}{N}$$

where R is the radial distance from the center of the anode to the vane tip; and N is the number of vanes. These dimensions are shown graphically in FIG. 9.

Conventional pulsed anode magnetrons typically use an a/p ratio below 0.95, which was believed to result in operating stability of the magnetron. It was generally believed that operating stability would degrade as a/p increased. However, it was discovered that the twinning was more prevalent at the lower values. Experimentation with magnetron design revealed that a ratio between 0.95 and 1.05 yielded reductions in twinning. By increasing the space between the cathode and anode vane tips relative to the pitch, it is believed that the desired bunching of the orbiting electrons under influence of the magnetic field is more efficient. This results in greater electronic interaction within the interaction region. In the preferred embodiment, an a/p ratio of 1.01 is utilized.

It was further recognized that the difficulty in side lobe control increased as the desired pulse width of the magnetron increased. Commercial demands had required pulse width increases from 5 to 18 microseconds. The modulators which provide the input pulse to the magnetrons were experiencing pulse droop, a condition in which current drops off at the end of the pulse. The pulse droop was determined to be a cause of the side lobes problem. The magnetrons can compensate for the pulse droop by adjusting the "pushing" value of the magnetron. Pushing is defined as a change in frequency for a given change in current amplitude, and is determined by the following equation:

$$\frac{\delta\omega}{\omega_0}=\frac{\sqrt{\frac{L}{C}}\,G\,\omega_0 K_2\,a\,g\,B}{2\sqrt{2}\,K_4 V_{dc}\eta_e}\tan\theta-\frac{1}{4}\,\frac{\omega_0}{\omega}\,\frac{\sqrt{\frac{L}{C}}\,G\sqrt{I}\cos\theta}{\sqrt{V_{dc}\eta_e}}$$

where $\omega$ is the $2\pi$ frequency, hot; $\omega_0$ is the $2\pi$ frequency, cold; square root of L/C is the anode impedance; G is the real part of admittance which includes $Q_L$; $K_2$ and $K_4$ are space charge factors; a is the cathode-anode spacing (described above); g is the gap between the anode segments at the vane tips; B is the dc magnetic field strength; $V_{dc}$ is the dc anode potential; $\eta_e$ is the electronic efficiency of a magnetron oscillator; $\theta$ is the phase angle between space harmonic and space charge bunch; and I is the dc anode current per bunch per unit of length in the axial direction in a crossed-field tube.

Although the magnetron components are manufactured to rigid tolerances, slight inconsistencies in material and assembly result in minute variations of the relative cathode and polepiece position, and would effect the pushing value. Thus, to adjust the final pushing value after manufacture, the magnetron 10 can be calibrated to adjust the a, B, $K_2$, $K_4$ and $\eta$ values by manipulating the position of the cathode 20 and polepiece 24 relative to the anode vane tips 44. The adjustment to $K_2$, $K_4$ and $\theta$ have minor effect in comparison to the effect of changing a and B.

In a preferred embodiment of the present invention, the magnet 30 is secured to a magnetic plate 52. Rather than being directly secured to the bottom panel 14, the magnetic plate 52 is offset from the bottom 14 by a plurality of set screws 54. The figures show there to be four set screws 54 spaced approximately 90 degrees apart, however, a larger or smaller number of set screws may be advantageously utilized as well. Other types of adjustment mechanisms can also be used.

By rotating one of the set screws 54 clockwise, the position of the magnetic plate 52 will be shifted applying an upward pressure on the portion of the pole sleeve 32 in the quadrant of the selected set screw 54. The material of the pole sleeve 32 at the elbow 34 will tend to deform under the pressure of the set screw adjustment. Since the cathode 20 and polepiece 24 are joined together, it should be apparent that deformation of the elbow joint 34 will result in adjustment of position of both the cathode surface 22 and the polepiece 24 relative to the anode vanes 46.

Figure 8:
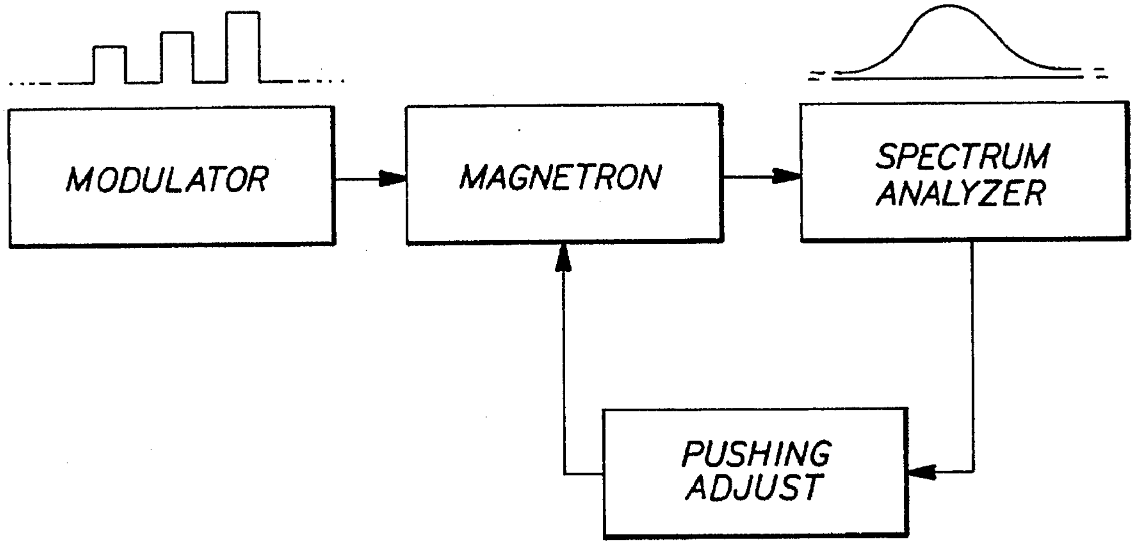
FIG. 8 shows a method for calibrating the pushing value for the magnetron.

To determine the extent of adjustment necessary, a method for adjusting the magnetron is provided. As shown in FIG. 8, the magnetron 10 is connected to a modulator which provides an input signal, and a spectrum analyzer is attached to an output of the magnetron to display the output spectrum of the magnetron. The modulator provides a periodic input signal comprising three sequential pulses of increasing amplitude. As described above, when the pushing value is properly selected, differing amplitude input signals will have no effect on the output frequency spectrum.

The output signal viewed on the spectrum analyzer readily shows whether the pushing value is correctly adjusted. If the value is out of adjustment, a shifted frequency spectrum will appear for each of the three input amplitude values. The operator will selectively adjust one of the set screws and determine whether the frequency shift is getting better or worse. If the shift is being made worse, the operator would then adjust the opposite set screw, disposed 180 degrees from the first set screw, to return the pushing value in the opposite direction. This procedure would then be repeated for the other two set screws. When complete, a single frequency spectrum will be viewed on the spectrum analyzer even though there are three sequential input pulses applied.

Figure 6:
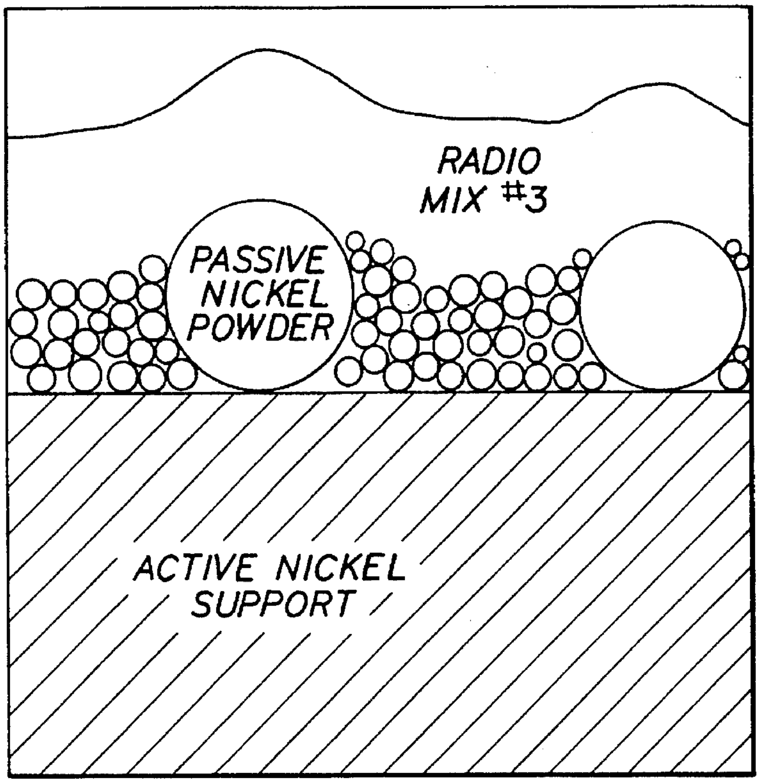
FIG. 6 PRIOR ART
FIG. 6 is an enhanced side view of a prior art cathode surface.
Figure 7:
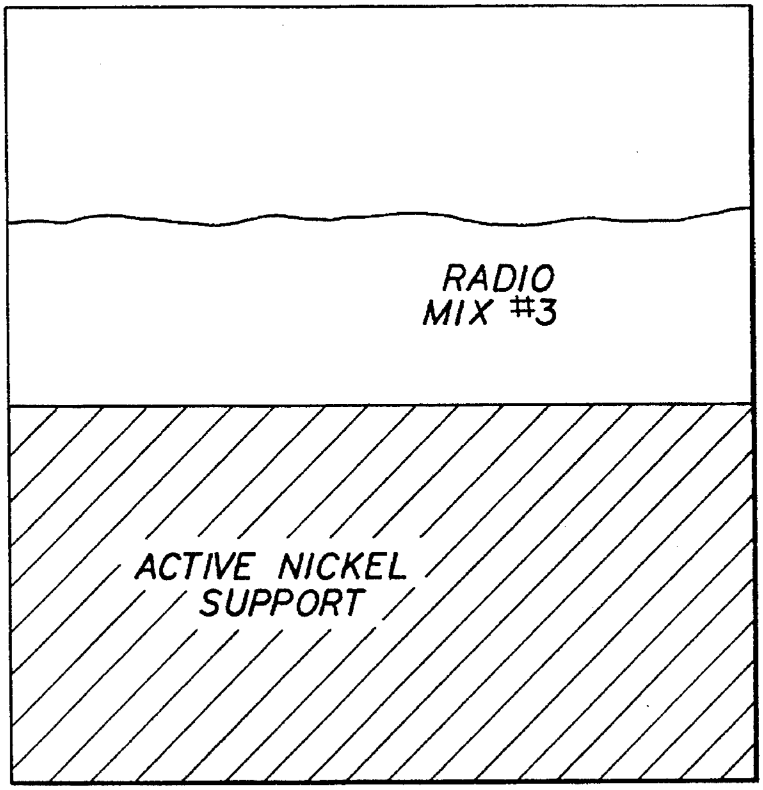
FIG. 7 shows an enhanced side view of a cathode surface formed in accordance with the method of the present invention.

To further improve the spectral performance of the magnetron, modifications to the cathode surface 22 are also employed. Referring to FIGS. 6 and 7, an enhanced view of the cathode surface is shown. In the prior art, as illustrated in FIG. 6, the cathode surface is formed of an active nickel cylinder coated with passive carbonyl nickel powder. Active nickel is an alloy of pure nickel with activators, such as carbon, manganese, or silicon. The activators are added in a mixture ratio of 0.08%. The activators are intended to increase electron emission from the cathode surface 22.

The passive nickel powder comprises pure nickel with significantly reduced levels of additional activators. The powder was sintered to the cylinder at a high temperature within a hydrogen atmosphere. Then, an emissive material was sprayed onto the coated cathode cylinder. An emissive material, known as Radio Mix No. 3, is generally preferred for this application. Radio Mix No. 3 is a commercial product of the J.T. Baker Chemical Co., and comprises a mixture of barium carbonate (57.3%), calcium carbonate (0.5%) and strontium carbonate (42.2%). The passive nickel coating provides a rough surface which was believed to improve the adhesive quality of the emissive material. Both large and small grain sizes of the passive nickel powder are used, as shown in the figure.

It has been discovered that this method of coating the cathode has a number of disadvantages. First, the passive nickel powder causes the applied emissive material to be relatively rough, which gives rise to nonuniform emission characteristics both from the cathode surface and from within the emissive layer. Second, the activators from the nickel surface cross over to the carbonyl nickel layer causing a region of high interface resistance. This resistance in the interface region tends to heat sections of the cylinder more than others, depending upon the distribution of activators and thickness variations of the carbonyl powder.

The combination of nonuniform emission and high interface resistance causes changes in beam shape and position from one pulse to another. As the beam changes in the interaction region, there is a change in capacitance associated with the out-of-phase condition of the space charge and the RF current on the anode vanes. This causes a shift in frequency referred to above as spectrum twinning.

To eliminate the nonuniform emission characteristics and resistivity, in the present invention the passive layer of carbonyl nickel is eliminated, allowing direct contact of the emissive coating to the active nickel support layer. This provides a smoother surface with less of an interface region which increases the emission quality of the cathode. To provide a clean, contaminant free cathode surface, the active nickel cylinder is processed by chemically cleaning the surface. Then, a dry hydrogen firing at 1,000° C. for 30 minutes is conducted, followed by vacuum firing at 1,000° C. for 30 minutes. This process cleans the cylinder of any contaminants, and makes it slightly less active. Then, the emissive coating is applied directly to the active nickel support layer, forming a smooth emitting surface.

The synergistic effect of combining each of the improvements discussed above results in a magnetron having a significantly improved spectral characteristic over the prior art. The inventor has found that both the twinning and side lobes previously experienced have diminished significantly with implementation of these improvements.

Having thus described a preferred embodiment of a method for improving the spectrum quality of a low power pulsed anode magnetron, it should be apparent to those skilled in the art that the aforestated objects and advantages have been achieved. Although the present invention has been described in connection with the preferred embodiment, it is evident that numerous alternatives, modifications, variations and uses will be apparent to those skilled in the art in light of the foregoing description.

The present invention is further defined by the following claims.

What is claimed is:

1. A method for calibrating a low power pulsed anode magnetron, comprising a cylindrical cathode having an emitting surface, a plurality of anode vanes radially disposed around said cathode with an interaction region provided between said emitting surface and innermost tips of said anode vanes, a magnetic polepiece joined to said cathode, and adjustment means for varying the relative position of said polepiece and cathode with respect to said anode vanes, wherein a ratio of the distance between the vane tips and the cathode surface over the center-to-center distance between adjacent ones of the vane tips is within a range between 0.95 and 1.05, said method comprising the steps of:

providing a modulated input signal to said magnetron comprising a repeated sequence of three input pulses having sequentially increasing amplitudes;

monitoring an output spectrum of said magnetron in response to said input pulses; and adjusting the position of said polepiece and said cathode until said frequency spectrum remains constant for each of said input pulses.

2. The method for calibrating the magnetron of claim 1, wherein said magnetron comprises a magnetic plate joined to said polepiece, and a plurality of set screws accessible from external to said magnetron, each of said set screws applying an inward force on said magnetic plate.

3. The method for calibrating the magnetron of claim 2, wherein said magnetron further comprises a deformable pole sleeve, said pole sleeve deforming under pressure by said set screws to secure said polepiece and cathode in an adjusted position.

4. The method for calibrating the magnetron of claim 1, wherein said emitting surface comprises active nickel on which an emissive coating is deposited.

* * * * *